United States Patent [19]

Foss

[11] Patent Number: 5,724,304
[45] Date of Patent: Mar. 3, 1998

[54] REPEATER WITH THRESHOLD MODULATION

[75] Inventor: Richard C. Foss, Kirkcaldy Fife, Scotland

[73] Assignee: Mosaid Technologies Incorporated, Kanata, Canada

[21] Appl. No.: 749,409

[22] Filed: Nov. 15, 1996

Related U.S. Application Data

[62] Division of Ser. No. 401,300, Mar. 9, 1995, Pat. No. 5,576,649, which is a continuation of Ser. No. 923,534, Aug. 3, 1992, abandoned.

[51] Int. Cl.[6] .................................................. G11C 13/00
[52] U.S. Cl. ...................... 365/230.06; 365/149; 365/222
[58] Field of Search ............................ 365/222, 189.01, 365/189, 230.01, 149, 150, 230.06

[56] References Cited

U.S. PATENT DOCUMENTS 5,119,340  6/1992  Slemmer ........................... 365/230.06

*Primary Examiner*—Terrell W. Fears
*Attorney, Agent, or Firm*—E. E. Pascal; R. A. Wilkes

[57] ABSTRACT

A method of repeating a pulse signal comprised of outputting a signal at a first voltage level upon a first rising edge of the pulse signal exceeding a low threshold, then raising the threshold and outputting the signal at another voltage level upon a second trailing edge of the pulse signal dropping below the raised threshold. An improved VLSI circuit has at least one conductive track containing distributed parasitic elements, the track being divided into two or more separate segments, a repeater connecting each of the segments, and apparatus for modulating the threshold of the repeater prior to and/or during the interval of a pulse carried by the track.

7 Claims, 3 Drawing Sheets

PRIOR ART (SRAM)

PRIOR ART (SRAM)

PRIOR ART (SRAM)

REPEATER WITH THRESHOLD MODULATION

This is a divisional of application Ser. No. 08/401,300 filed Mar. 9, 1995, now U.S. Pat. No. 5,576,699 which is a continuation of Ser. No. 07/923,534 filed Aug. 3, 1992, now abandoned.

FIELD OF THE INVENTION

This invention relates to very large scale integrated (VLSI) circuits, and particularly to a repeater that can be used to reduce interconnection delays in long conduction paths on or in a silicon chip. A good example of such a conductive path is the wordline in a semiconductor memory.

BACKGROUND TO THE INVENTION

VLSI circuits such as DRAMs (dynamic random access memories) often have long conductive tracks, such as wordlines extending long distances e.g. 1 cm across a chip. The long conductive tracks contain distributed parasitic elements, distributed series resistance and distributed parallel capacitance. This causes delay and degradation of pulse signals carried along the tracks, so that it takes significantly longer for elements controlled by the pulse signals to be enabled at the end of the track than elements at the beginning of the track. In order to facilitate synchronous operation of the controlled elements, operation of the entire chip is slowed to the speed of the slowest operating elements, i.e. those at the ends of the tracks.

To improve operation of long tracks, in prior art SRAMs (static random access memories) the tracks are divided into two or more segments. Signal refreshing circuits known as repeaters are connected between the end of one segment and the beginning of the next, in order to allow signal flow from one end to the other of the track. The result is a restandardization of the pulse signal passing down the track, compensating for the square law degradation relationship between delay and line length. Unfortunately, while such repeaters have been able to improve the rise and fall time characteristics of a pulse passing down the track, optimizing the delay to rising edges of signals degrades the falling edge delay and vice-versa.

The repeater circuit used in SRAMs could not be used to repeat DRAM wordline signals because DRAM wordline signals are required to be driven to a level above the main supply voltage. In prior art DRAMs this was done using multiphase bootstrap circuits unsuitable for use in repeaters. In SRAM circuit the repeaters could be simple inverters fed from the main supply voltage and therefore could not drive the wordline to the level required for use in a DRAM.

I have invented, as described in U.S. patent application Ser. No. 680,994, a static DRAM wordline driver operated from a high voltage pump supply. While not related to this invention, I have discovered that a repeater as described herein can for the first time be used to improve the pulse characteristics of DRAM wordlines, while previously repeaters could only be used for such purposes in SRAMs.

SUMMARY OF THE INVENTION

The present invention improves the performance of these repeaters by arranging for the repeater amplifiers to have differing parameters when handling rising edges of pulse signals from when they are handling falling edges of pulse signals, improving both.

In accordance with an embodiment of the invention, in a VLSI circuit having at least one long conductive track having distributed parasitic elements, the track is divided into two or more separate segments, and at least one inverter acting as a signal repeater joins pairs of the separate segments together whereby a signal can travel the length of the track through the inverters. The repeater used in this embodiment has the characteristic of outputting a signal at a first voltage level upon a first rising edge of the pulse signal exceeding a low threshold, then having a raised threshold and outputting the signal at another voltage level upon a second trailing edge of the pulse signal dropping below the raised threshold.

The invention can be usefully implemented, e.g. in a semiconductor memory comprised of bitlines, wordlines crossing the bitlines, and bit storage cells adjacent the intersection of bitlines and wordlines enabled to be connected to the bitlines upon the presence of pulse signals applied to the wordlines, the wordlines extending past and crossing a large number of bitlines, each wordline being divided into at least two divided wordline segments. A repeater having a modulated threshold is connected between an end of one segment and the beginning of an adjacent segment of the same wordline for connecting the segments together and restoring the pulse signals as they pass down the wordline.

In accordance with another embodiment, a method of repeating a pulse signal is comprised of outputting a signal at a first voltage level when a first dropping edge of the pulse signal drops below a high threshold, then lowering the threshold and outputting a signal at a second output voltage level when the pulse signal rises above the lowered threshold.

In accordance with another embodiment, a repeater circuit for pulse signals is comprised of apparatus having a conduction threshold for receiving a pulse signal, apparatus for outputting a signal at a first voltage level upon a first rising edge of the pulse signal exceeding the threshold, apparatus for raising the threshold following the first rising edge, and apparatus for outputting a signal at a second voltage level upon a second trailing edge of the pulse signal dropping below the raised threshold.

In accordance with another embodiment, a repeater circuit for pulse signals is comprised of apparatus having a conduction threshold for receiving a pulse signal, apparatus for outputting a signal at a first voltage level upon a first dropping edge of the pulse signal dropping below the threshold, apparatus for lowering the threshold following first dropping edge, and apparatus for outputting a signal at a second voltage level upon a second trailing edge of the pulse signal rising above the lowered threshold.

In accordance with another embodiment a semiconductor memory has at least one wordline conductive track containing distributed parasitic elements, the memory being a DRAM, the track being divided into two or more separate segments, and a repeater connecting pairs of the separate segments together for restoring a pulse signal passing therethrough.

BRIEF INTRODUCTION TO THE DRAWINGS

A better understanding of the invention will be obtained by reference to the detailed description below, in conjunction with the following drawings, in which:

FIG. 1A is a schematic diagram showing distributed parasitic elements along a typical prior art SRAM wordline which contains a repeater, FIG. 1B are graphs of a pulse signal shape at various positions along the wordline of FIG. 1A where no repeater is used, FIG. 2 is a schematic design illustrating the prior art concept of the invention in simple form, FIG. 3 is a schematic diagram illustrating a prior art circuit of the inverter elements of FIG. 2, FIG. 4 is a schematic diagram of an alternate prior art circuit of the inverter elements of a repeater, FIG. 5A is a schematic diagram of an embodiment of a repeater in accordance with the present invention, and FIG. 5B are graphs of the rising edge of a pulse signal carried by a DRAM wordline which contains the repeater of FIG. 5, at various positions along the line.

DETAILED DESCRIPTION OF THE INVENTION

Figure 1A:
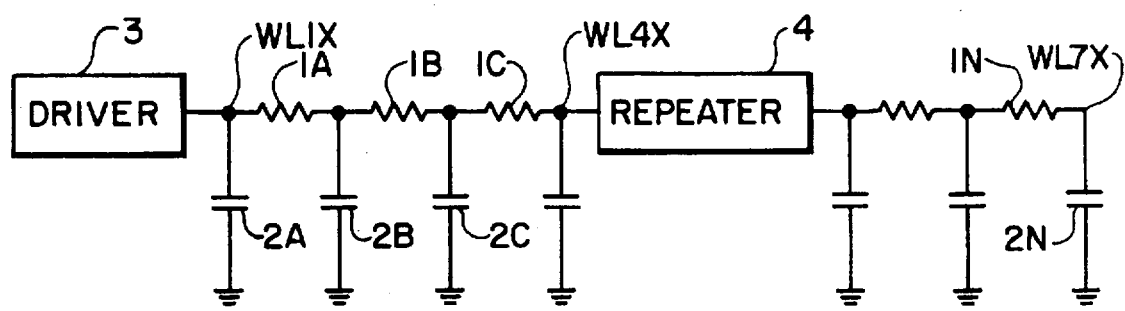

A representation of a long conducting track on a VLSI semiconductor chip such as a memory chip wordline in accordance with the prior art is illustrated in FIG. 1A. The wordline is comprised of distributed serial resistors 1A–1N and distributed parallel capacitors 2A–2N. One end of the wordline is connected to the output of a driver 3. In an SRAM the wordline is divided and a repeater 4 connects the parts of the wordline together.

In operation, a pulse is output from driver 3. As a result, first a leading edge of a rising pulse followed by a trailing, dropping edge of a pulse is launched into the end of the wordline.

Because of the distributed parasitic elements, the rise and fall times of the leading and trailing edges of the pulse signal are degraded. Consequently, it takes a longer time for a pulse to rise to a particular operation threshold level at the end of the wordline than it does at the beginning of the wordline.

Figure 1B:
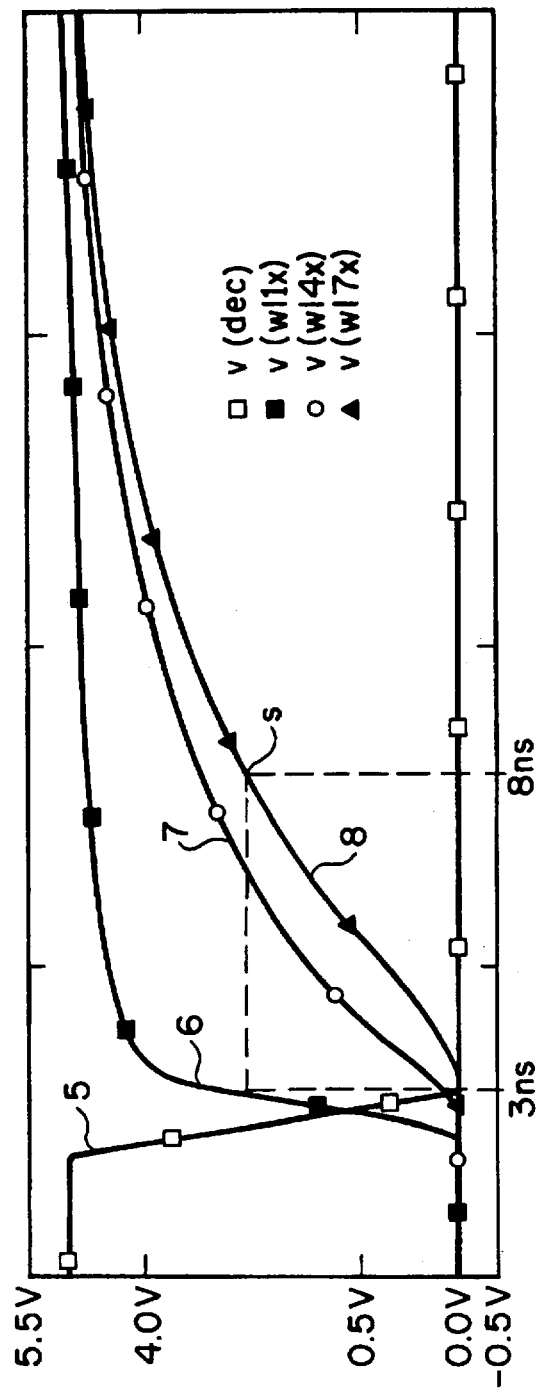

FIG. 1B illustrates this phenomenon for the case where no repeater is used. Driver 3 outputs a pulse starting at the 2 nanosecond time point on the graph. The result at position WL1X of the wordline is the signal wave shape 6. The wave shape at position WL4X of the wordline is shown as wave shape 7 and the signal at position WL7X, the end of the wordline, is shown as wave shape 8. The progressive degradation along the wordline is evident.

Typically a memory starts sensing (access is made to the bit storage capacitor) once the wordline voltage exceeds some particular level. This point is shown on curve 8 at the 8 nanosecond point. However the same voltage point on curve 6, at the beginning of the wordline, is at about the 3 nanoseconds point. Thus there is a sensing delay between the beginning and end of the wordline of about 5 nanoseconds. The memory must be slowed down so that bit sensing can occur at one time, which must be at the latest time of the sensing amplifier enablement at the ends of the wordlines.

Figure 3:
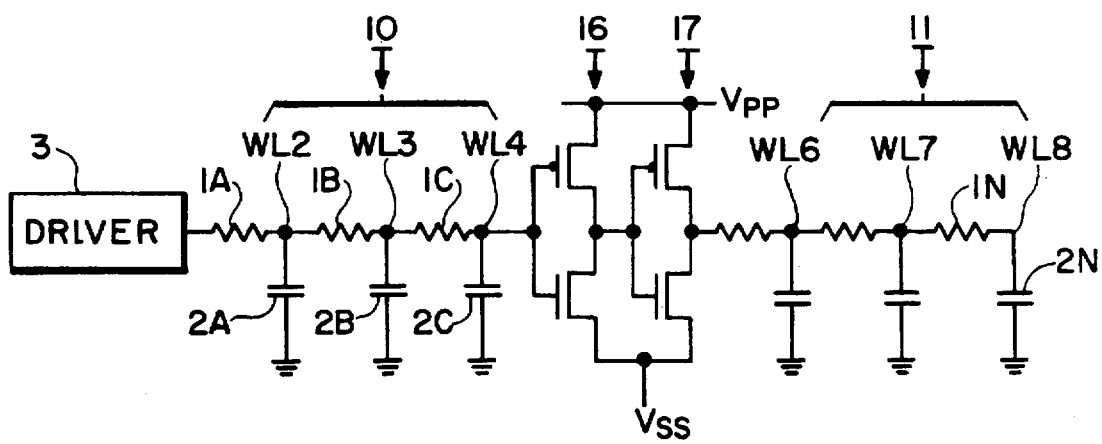
Figure 2:
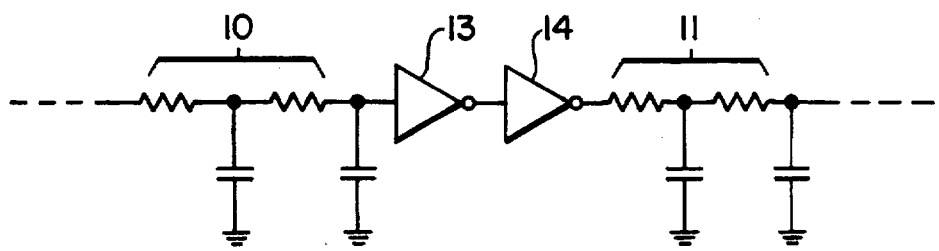

To improve the result, the repeater has been implemented in an SRAM as a pair of serially connected inverters 13 and 14, as shown in FIG. 2, connecting conductive paths 10 and 11. FIG. 3 illustrates a schematic of the inverters, implemented as a pair of CMOS inverters 16 and 17 connected between a pair of voltage rails $V_{pp}$ and $V_{ss}$. The end of segment 10 of the conductive path is connected at position WL4X to the input of the first inverter 16 and the output of inverter 17 is connected to the beginning of the following segment 11 at position WL5.

The threshold of conduction of the first inverter 16 is set to be the starting level of the signal from the preceding segment prior to the introduction of a pulse. If a positive going pulse edge is of key importance, the first inverter is given a low threshold. Conversely if a negative going pulse edge is more important, the first inverter is made to have a high threshold. However, this prior art form of repeater cannot give optimum delay for both rising and falling edges.

Figure 4:
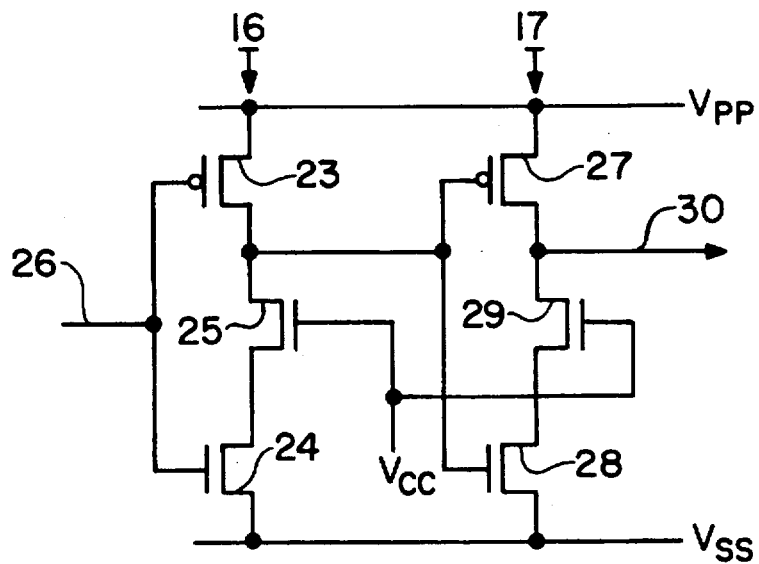

FIG. 4 illustrates another form of inverter that may be used as a repeater. In a complementary pair of transistors 23 and 24 the drain of one transistor 23 is connected to the voltage rail $V_{pp}$ and the source of the other transistor 24 of the pair is connected to another voltage rail $V_{ss}$. The gates are connected together to receive an input signal pulse.

A third transistor 25 having the same polarity type as transistor 24 has its source-drain circuit connected between the source of connector 23 and the drain of transistor 24.

To form the second inverter, a second complementary pair of transistors 27 and 28 are connected with the drain of transistor 27 to voltage rail $V_{pp}$ and the source of transistor 28 to the voltage rail $V_{ss}$. The gates are connected together and to the source of transistor 23. A third transistor 29 of the second inverter having the same polarity type as transistor 28 is connected with its source-drain circuit in series between the source of transistor 27 and the drain of transistor 28. The source of transistor 27 provides an output lead 30 for e.g. connection to the beginning of the following segment of the conducting path such a divided wordline.

The gates of transistors 25 and 29 are connected together to a fixed voltage $V_{cc}$, which may be equal to or lower than $V_{pp}$. This form of inverter is well known and allows small geometry transistors to be used with supply voltages which exceed the voltage rating of a single transistor. Guarding against voltage stress in this way is sometimes called "cascoding". The circuit otherwise operates in a manner similar to the circuit of FIG. 3, and the repeater threshold can be made high or low depending on the application as described above.

However the fixed threshold remains at the same level for rising or falling edges of a pulse. This allows optimization of either the rising or falling edges of a pulse, but not both.

It should be noted that now the circuits described above can be used in a DRAM, due to the creation of the DRAM wordline driver which I co-invented as noted earlier in this specification.

In some cases both rising and falling edges of a pulse are equally important and in the description below a novel repeater having a high threshold for negative going edges and a low threshold for positive going edges is described. Especially when series N-channel devices are used to guard against voltage stress effects, this threshold change is easily and inexpensively achievable. Reference is made to the circuit of FIG. 5A.

The circuit is similar to the one in FIG. 4, except that an additional, fourth transistor 32 having the same polarity type as transistor 25 has its source-drain circuit connected in parallel with transistor 25, and is driven from a separate pulse source 35 which modulates the threshold of the first inverter.

In operation, assume that a rising from a low level pulse 34 is to be applied to input lead 26. The high level on the gate 36 of transistor 32 will have established a low threshold of operation of the first inverter 16.

Now following the input pulse on node 26, pulse 34, having been raised to a high level, but before the trailing edge of that pulse, a dropped pulse 35 is applied to gate 36 of transistor 32 from pulse source 37. By turning off transistor 32 this raises the threshold of inverter 16. The result is switching of inverter 16 at an earlier point on the trailing edge of pulse 34 than would have occurred if the pulse 35 had not raised the inverter threshold. Following the trailing edge of pulse 34, the trailing edge of pulse 35 is applied to gate 36, changing the threshold of inverter 16 to its original level. Thus the threshold of inverter 16 has been modulated by the timing and amplitude of pulse 35.

The change in threshold will depend on the ratio of sizes between transistors 25 and 32, and between transistors 32 and 24. Typically transistors 24 and 32 will be comparable in size and transistor 25 small, i.e. with lower conductivity.

The wave shape of pulse 35 is not critical. A slow falling edge any time during the high level interval of pulse 34 will be sufficient to change the threshold of inverter 16. Likewise a slow non-critical rising edge at any time during the low level interval of pulse 34 will serve.

It should be noted that transistor 25 could be deleted altogether, leaving a floating low level at the input of the second inverter 17. This would be safe if the signal 35 falls just prior to the fall of the signal 34.

Figure 5B:
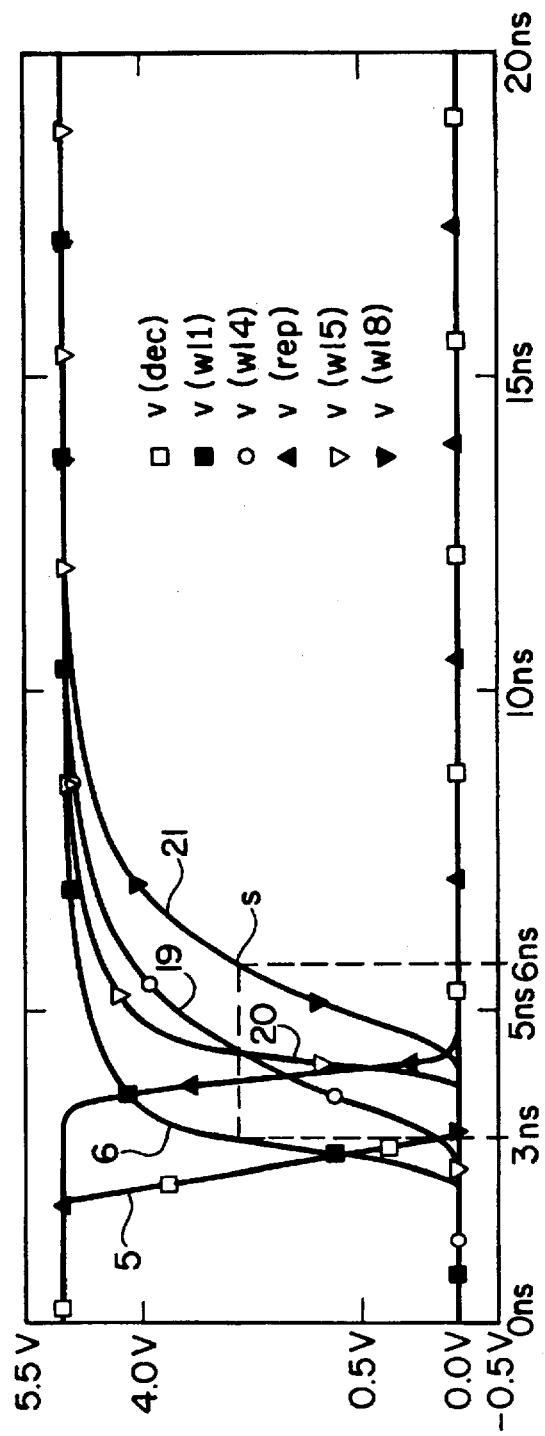

FIG. 5 illustrates the improved result of the new circuit. The slightly degraded signal at the input of the repeater at WL4 is shown as curve 19 and the refreshed signal at WL5 is shown as curve 20. While curve 20 is delayed from the input curve at WL1, it clearly shows a substantially improved wave shape; its slope has been increased substantially.

The result at the end of the wordline at WL8 is curve 21. The sensing point S now is at the 6 nanosecond time point rather than the 8 nanosecond time point, a delay of only 3 nanoseconds from the sensing level at the beginning of the wordline, cutting the sensing time nearly in half. This is not achieved at the expense of falling edge delay which is also enhanced.

Figure 5A:
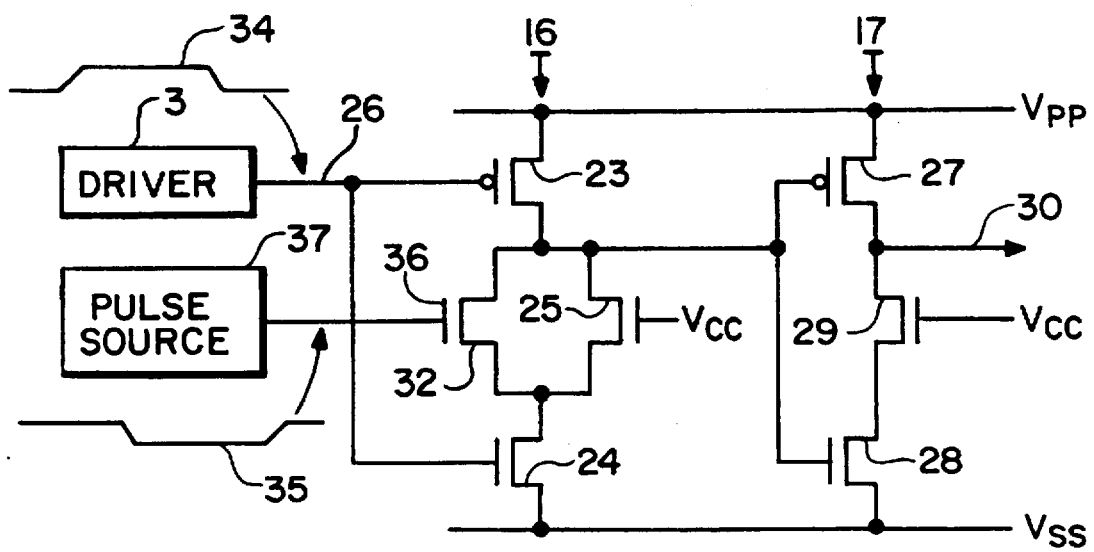

Transistors 25 and 32 in the circuit of FIG. 5A can be replaced by a single transistor receiving a gate voltage changing from $V_{cc}$ to a lower level which is greater than the high level of pulse 34, leaving the single transistor partly conducting with a higher impedance during the low level of pulse 35. For example, pulse 35 could be switched from $V_{dd}$ to $V_{dd}/2$ (approximately) in a DRAM where $V_{dd}/2$ is readily available.

It should also be noted that as well as allowing individual optimization of delay to rising and falling edges of the repeated signal 34, additional advantage is achieved in that the current drawn by the first inverter 16 during the relatively slow falling edge at its input is reduced.

A person understanding this invention may now conceive of alternative structures and embodiments or variations of the above. All of those which fall within the scope of the claims appended hereto are considered to be part of the present invention.

I claim:

1. A semiconductor memory comprising bitlines, wordlines crossing said bitlines, and bit storage cells adjacent the intersection of bitlines and wordlines enabled to be connected to said bitlines upon the presence of pulse signals applied to the wordlines, the wordlines extending past and crossing a large number of bitlines, each wordline being divided into at least two approximately evenly divided wordline segments, and a repeater connected between an end of one segment and a beginning of an adjacent segment of the same wordline for connecting said segments together and restoring said pulse signals as they pass down the wordline, and means for modulating the threshold of the repeater between rising and falling edges of pulses of said pulse signals.

2. A semiconductor memory having at least one wordline conductive track containing distributed parasitic elements, the memory being a DRAM, said track being divided into two or more separate segments, and a repeater connecting pairs of the separate segments together for refreshing a pulse signal passing therethrough.

3. A memory as defined in claim 2 in which the repeater is comprised of at least one inverter.

4. A memory as defined in claim 3 including means for varying the threshold of operation of a first of said at least one inverter at a time between a leading and trailing edge of said pulse signal.

5. A DRAM semiconductor memory comprising bitlines, wordlines crossing said bitlines, and bit storage cells adjacent the intersection of bitlines and wordlines enabled to be connected to said bitlines upon the presence of pulse signals applied to the wordlines, the wordlines extending past and crossing a large number of bitlines, each wordline being divided into at least two approximately evenly divided wordline segments, and a repeater connected between an end of one segment and a beginning of an adjacent segment of the same wordline for connecting said segments together and restoring said pulse signals as they pass down the wordline.

6. A semiconductor memory as defined in claim 2, said repeater comprising means having a conduction threshold for receiving a pulse signal, means for outputting a signal at a first voltage level upon a first rising edge of the pulse signal exceeding said threshold, means for raising said threshold following said first rising edge, and means for outputting a signal at a second voltage level upon a second trailing edge of said pulse signal dropping below said raised threshold.

7. A semiconductor memory as defined in claim 4, said first of said at least one inverter comprising means having a conduction threshold for receiving a pulse signal, means for outputting a signal at a first voltage level upon a first rising edge of the pulse signal exceeding said threshold, means for raising said threshold following said first rising edge, and means for outputting a signal at a second voltage level upon a second trailing edge of said pulse signal dropping below said raised threshold.

* * * * *